(12) United States Patent
Lee et al.

(10) Patent No.: US 10,770,015 B2
(45) Date of Patent: Sep. 8, 2020

(54) DISPLAY APPARATUS HAVING A SMALL BEZEL

(71) Applicant: SAMSUNG DISPLAY CO., LTD., Yongin-si, Gyeonggi-Do (KR)

(72) Inventors: Kye-Uk Lee, Seoul (KR); Kee-Bum Park, Cheonan-si (KR); Yanghee Kim, Busan (KR); Seunghee Oh, Asan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 148 days.

(21) Appl. No.: 15/812,315

(22) Filed: Nov. 14, 2017

(65) Prior Publication Data
US 2018/0166037 A1  Jun. 14, 2018

(30) Foreign Application Priority Data

Dec. 8, 2016 (KR) ........................ 10-2016-0166333

(51) Int. Cl.
G09G 3/36 (2006.01)
G09F 9/30 (2006.01)
H01L 27/12 (2006.01)

(52) U.S. Cl.
CPC ............ G09G 3/3677 (2013.01); G09F 9/30 (2013.01); H01L 27/1214 (2013.01); G09G 3/3688 (2013.01); G09G 2300/0408 (2013.01); G09G 2300/0426 (2013.01); G09G 2300/08 (2013.01); G09G 2310/0232 (2013.01)

(58) Field of Classification Search
USPC .......................................................... 345/92
See application file for complete search history.

(56) References Cited

U.S. PATENT DOCUMENTS

| | | | | |
|---|---|---|---|---|
| 2004/0125258 A1* | 7/2004 | Moon | .................. | G02F 1/1345 349/43 |
| 2004/0135956 A1* | 7/2004 | Kim | ..................... | G02F 1/1345 349/148 |
| 2004/0233184 A1* | 11/2004 | Toriumi | .............. | G09G 3/3688 345/204 |
| 2006/0274029 A1* | 12/2006 | Hong | ...................... | G09G 3/20 345/104 |

(Continued)

FOREIGN PATENT DOCUMENTS

KR  10-2016-0013359  2/2016

Primary Examiner — Chineyere D Wills-Burns
(74) Attorney, Agent, or Firm — F. Chau & Associates, LLC

(57) ABSTRACT

A display apparatus includes a display area, in which an image is displayed, and a peripheral area, which is non-display area surrounding the display area. The display apparatus includes a plurality of pixels disposed in the display area, a data integrated circuit (IC) disposed in a first side portion of the peripheral area, the peripheral area is disposed adjacent to the display area, a gate IC disposed in a second side portion of the peripheral area, the display area is disposed between the first and second side portions, a data fan-out part disposed in the first side portion, the data fan-out part extends from the data IC to the display area, the data fan-out part includes a plurality of wires that are spaced apart from each other in a fanned out manner, and a gate connecting part, disposed in the peripheral area, electrically connected to the gate IC.

16 Claims, 6 Drawing Sheets

(56) References Cited

U.S. PATENT DOCUMENTS

| | | | |
|---|---|---|---|
| 2008/0042549 A1* | 2/2008 | Song | G09G 3/3225 313/498 |
| 2008/0094321 A1* | 4/2008 | Park | G09G 3/3225 345/76 |
| 2010/0085335 A1* | 4/2010 | Kato | G09G 3/3677 345/204 |
| 2014/0028534 A1* | 1/2014 | Park | G09G 3/20 345/84 |
| 2014/0139413 A1* | 5/2014 | Kwon | G09G 3/3208 345/82 |
| 2015/0187309 A1* | 7/2015 | Kim | H01L 29/78669 345/99 |
| 2015/0194107 A1* | 7/2015 | Bae | G09G 3/3607 345/696 |
| 2015/0211707 A1* | 7/2015 | Watanabe | G02F 1/133308 345/667 |
| 2016/0135619 A1* | 5/2016 | Shields | A47G 1/065 40/711 |
| 2017/0084239 A1* | 3/2017 | Lee | G09G 3/3648 |

\* cited by examiner

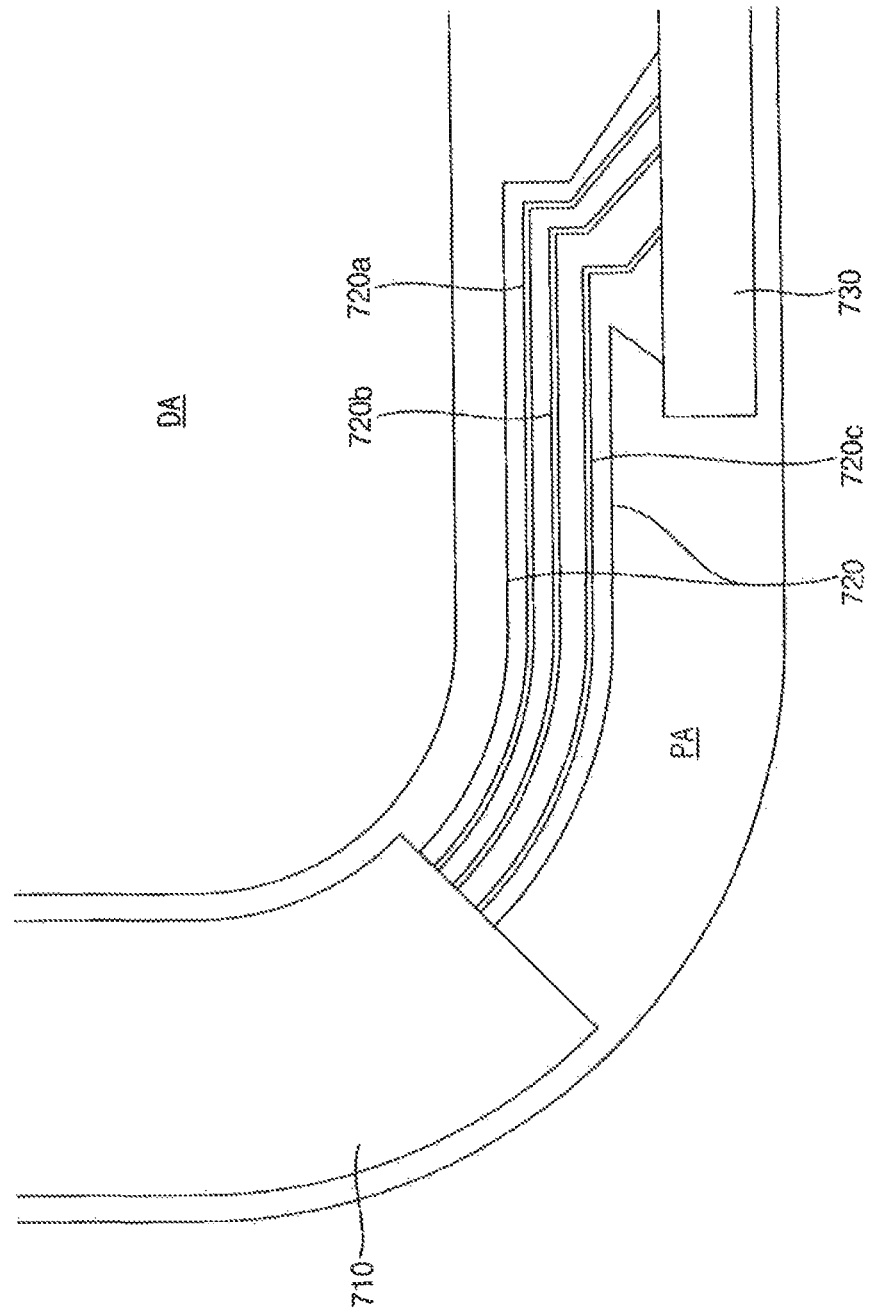

DISPLAY APPARATUS HAVING A SMALL BEZEL

CROSS-REFERENCE TO RELATED APPLICATION

This application claims priority under 35 U.S.C. § 119 to Korean Patent Application No. 10-2016-0166333, filed on Dec. 8, 2016, the disclosure of which is incorporated by reference herein in its entirety.

TECHNICAL FIELD

The present invention relates to a display apparatus. More particularly, the present invention relates to a display apparatus having a small bezel.

DISCUSSION OF THE RELATED ART

Display apparatuses may be manufactured to be small and light. Cathode ray tube (CRT) display apparatuses may have good image characteristics and a low price. However, the CRT display apparatuses may be large and heavy. Therefore, display apparatuses such as plasma display apparatuses, liquid crystal display apparatuses and organic light emitting display apparatuses may be in demand due to their small size, light weight and low power consumption characteristics.

A display apparatus may include a display area in which an image is displayed, and a peripheral area (bezel) which surrounds the display area. The peripheral area might not display an image. Various driving circuits and wires for displaying an image on the display area may be disposed in the bezel. Thus, a width of the bezel may be increased by the driving circuit and the wirings.

In addition, a thickness of the bezel might not be uniform due to the driving circuits and wirings.

SUMMARY

According to an exemplary embodiment of the present invention, a display apparatus includes a display area, in which an image is displayed, and a peripheral area, which is non-display area, the peripheral area surrounding the display area. The display apparatus includes a plurality of pixels disposed in the display area, a data integrated circuit (IC) disposed in a first side portion of the peripheral area, wherein the peripheral area is disposed adjacent to the display area, a gate IC disposed in a second side portion of the peripheral area, wherein the display area is disposed between the first and second side portions of the peripheral area, a data fan-out part disposed in the first side portion of the peripheral area, wherein the data fan-out part extends from the data IC to the display area, wherein the data fan-out part includes a plurality of wires that are spaced apart from each other in a fanned out manner, and a gate connecting part electrically connected to the gate IC, wherein the gate connecting part is disposed in the peripheral area.

According to an exemplary embodiment of the present invention, a display apparatus includes a display area in which an image is displayed, and a peripheral area which is non-display area, wherein the peripheral area surrounds the display area. The display apparatus includes a plurality of pixels disposed in the display area, and a data IC and a gate IC disposed in the peripheral area. The display area has a polygonal shape, and a first corner of the display area is curved. The gate IC and the data IC are respectively disposed adjacent to different edges of the display area. A first corner of the peripheral area, which corresponds to the first corner of the display area, is curved to match a curvature of the first corner of the display area.

According to an exemplary embodiment of the present invention, a display apparatus includes a first pixel disposed in a display area, a first data IC electrically connected to the first pixel and disposed in a peripheral area, wherein the peripheral area surrounds the display area on at least one side thereof, and a gate IC electrically connected to the first pixel and disposed in the peripheral area. The first data IC is disposed adjacent to a first edge of the display area. The gate IC is disposed adjacent to a second edge of the display area. The second edge is opposite to the first edge.

BRIEF DESCRIPTION OF THE DRAWINGS

The above and other features of the present invention will become more apparent by describing in detail exemplary embodiments thereof with reference to the accompanying drawings, in which:

FIG. 6 is an enlarged plan view illustrating a lower left portion of the display apparatus of FIG. 1, according to an exemplary embodiment of the present invention.

DETAILED DESCRIPTION OF THE DRAWINGS

Hereinafter, the present invention will be described in detail with reference to the accompanying drawings.

Figure 1:
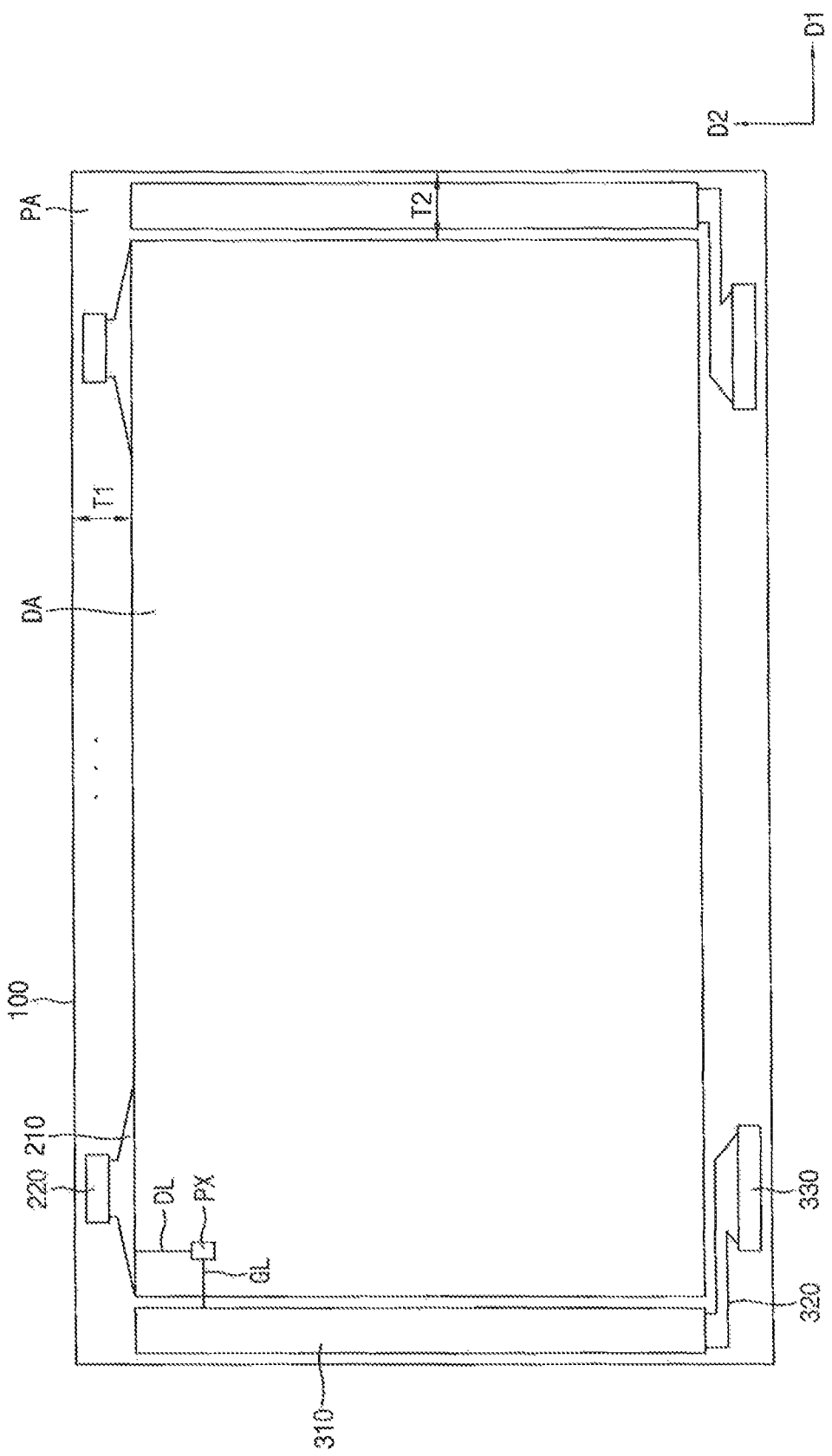
FIG. 1 is a plan view illustrating a display apparatus according to an exemplary embodiment of the present invention.

FIG. 1 is a plan view illustrating a display apparatus according to an exemplary embodiment of the present invention.

Referring to FIG. 1, a display apparatus may include a display area DA and a peripheral area PA.

The display area DA may display an image on a plane defined by a first direction D1 and a second direction D2. The first and second directions D1 and D2 may be substantially perpendicular to each other.

The peripheral area PA may surround the display area DA. The peripheral area PA is non-display area. A portion of the peripheral area PA, which is adjacent to the display area DA in the second direction D2, for example, an upper side portion and a lower side portion of the peripheral area PA, may have a first width T1. A portion of the peripheral area PA, which is adjacent to the display area DA in the first direction D1, for example, a right side portion and a left side portion of the peripheral area PA, may have a second width T2. The first width T1 and the second width T2 may be the same as each other or different from each other.

The display apparatus 100 may include a plurality of pixels PX, a plurality of gate lines GL and a plurality of data lines DL disposed in the display area DA. For convenience of illustration, one pixel PX, one gate line GL, and one data line DL are shown in FIG. 1.

The gate line GL may extend in the first direction D1 and the data line DL may extend in the second direction D2.

Each of the pixels PX may include a switching element, a liquid crystal capacitor and a storage capacitor electrically connected to the switching element. The pixels PX may be arranged in a matrix form in the display area DA. For example, the switching element may be a thin film transistor including a semiconductor layer. The semiconductor layer may include, for example, amorphous silicon.

The display apparatus 100 may include a data fan-out part 210, a data integrated circuit (IC) 220, an amorphous silicon gate (ASG) driving circuit 310, a gate connecting part 320 and a gate IC 330 disposed in the peripheral area PA.

The data fan-out part 210 may be disposed in an upper portion (or lower portion) of the peripheral area PA, which is adjacent to the display area DA, in the second direction D2. The data fan-out part 210 may be electrically connected to the data lines DL and the data IC 220. The data fan-out part 210 may be spread out in a direction from the upper portion of the peripheral area PA to the display area DA. For example, the wires/patterns included in the data fan-out part 210 may be progressively spaced apart from each other in a direction toward the display area DA.

The data IC 220 may be disposed in the upper side portion (or lower portion) of the peripheral area PA. The data IC 220 may be electrically connected to the data fan-out part 210. The data IC 220 may generate data signals from input signals, received from an external device, to provide the data signals to the data lines DL for driving the pixels PX. The data signals may be generated by the data IC 220, and may be provided to the pixels PX through the data fan-out part 210 and the data lines DL. The data IC 220 may be an integrated circuit fabricated in a chip form and may be mounted on a first substrate, described below, and electrically connected to the data fan-out part 210.

The ASG driving circuit 310 may be disposed in a left side portion (or right side portion, or both of the left and right side portions) of the peripheral area PA to be disposed near or adjacent to the display area DA in the first direction D1. The ASG driving circuit 310 may generate a plurality of gate signals from preliminary gate signals received from the gate IC 330, described below, to provide the gate signals to the gate lines GL. The gate signals may be generated from the ASG driving circuit 310 and provided to the pixels PX through the gate lines GL.

The ASG driving circuit 310 may be an amorphous silicon gate circuit formed in the peripheral area PA. The ASG driving circuit 310 may be formed simultaneously with a thin film transistor being formed in the display area DA. Thus, the ASG driving circuit 310 may include a thin film transistor including a semiconductor layer, the semiconductor layer including amorphous silicon.

The gate connecting part 320 may electrically connect the ASG driving circuit 310 to the gate IC 330. The gate connecting part 320 may be extended from the ASG driving circuit 310 to the gate IC 330 along the peripheral area PA.

The gate IC 330 may be disposed in the lower portion (or the upper portion) of the peripheral area PA. The gate IC 330 may be electrically connected to the gate connecting part 320. The gate IC 330 may generate the preliminary gate signals from input signals received from an external device for driving the pixels PX. The preliminary gate signals may be generated from the gate IC 330 and provided to the ASG driving circuit 310 through the gate connecting part 320. The gate IC 330 may be an integrated circuit fabricated in a chip form and may be mounted on the first substrate and electrically connected to the gate connecting part 320.

The display apparatus 100 may include the gate lines GL, the data lines DL, the pixels PX, the switching elements, a first substrate, a second substrate facing the first substrate and a liquid crystal layer disposed between the first substrate and the second substrate. The data fan-out part 210, the ASG driving circuit 310 and the gate connecting part 320 may be formed on the first substrate. A common electrode may be formed on the second substrate.

According to an exemplary embodiment of the present invention, the gate IC 330 is disposed in the lower side portion of the peripheral area PA, the data IC 220 is disposed in the upper side portion of the peripheral area PA, and the ASG driving circuit 310 is disposed in the right side and/or left side portion of the peripheral area PA so that the driving circuits may be distributed across the peripheral area PA. Accordingly, the first width T1 and the second width 12 may each be relatively small and substantially equal to each other. Thus, a display apparatus may have a small bezel. For example, according to an exemplary embodiment of the present invention, the first and second widths of the peripheral area of a display apparatus (e.g., a thickness of the bezel) may be designed to be 5 mm or less.

In addition, according to an exemplary embodiment of the present invention, a signal for driving the display apparatus is provided to the pixels PX through the gate IC 330, the gate connection part 320, the ASG driving circuit 310, and the gate lines GL. However, when the display apparatus does not include the ASG driving circuit 310, a gate signal formed from the gate IC 330 may be provided directly to the gate lines GL.

Figure 2:
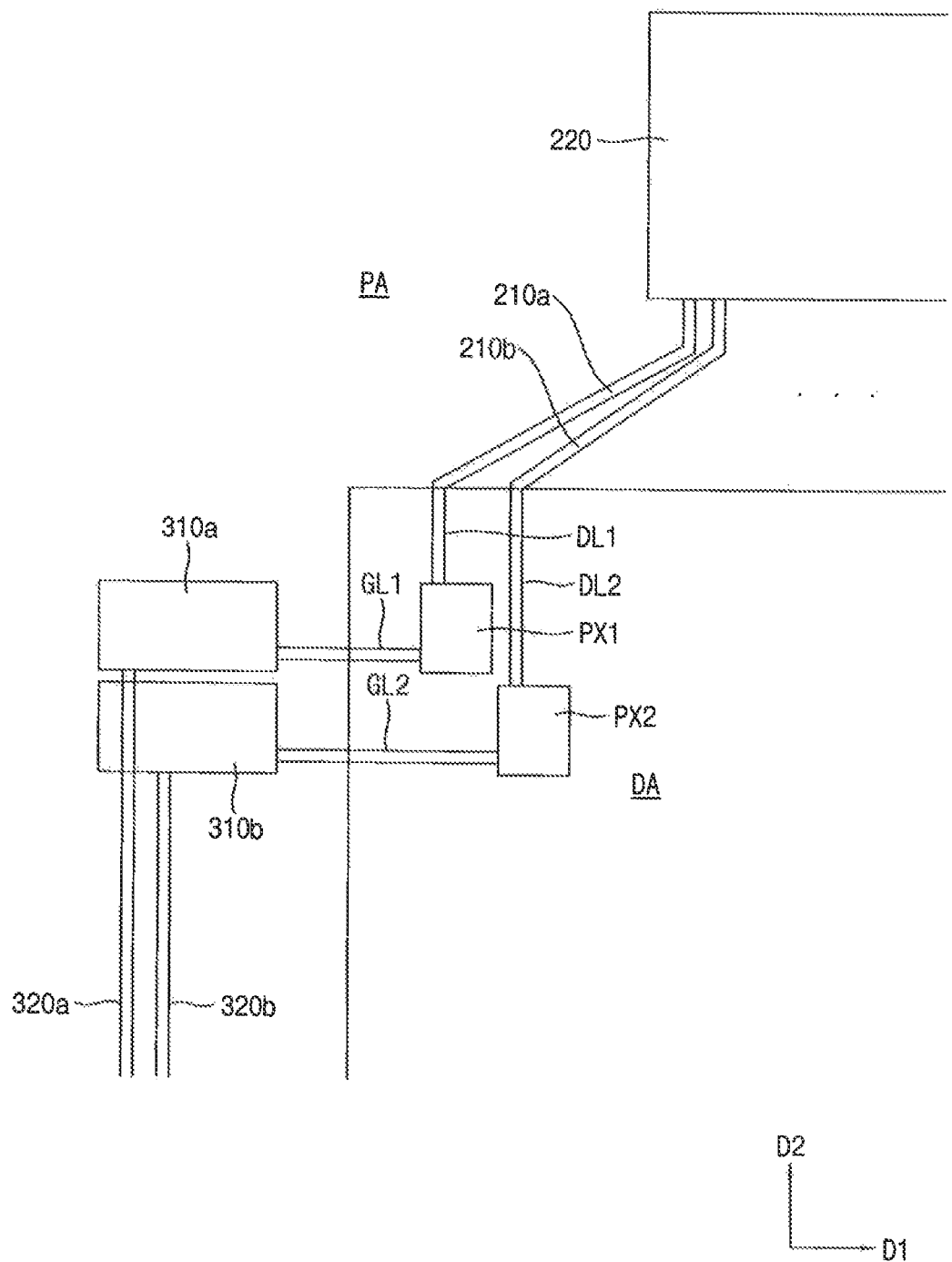
FIG. 2 is an enlarged plan view illustrating an upper left portion of the display apparatus of FIG. 1, according to an exemplary embodiment of the present invention.
Figure 3:
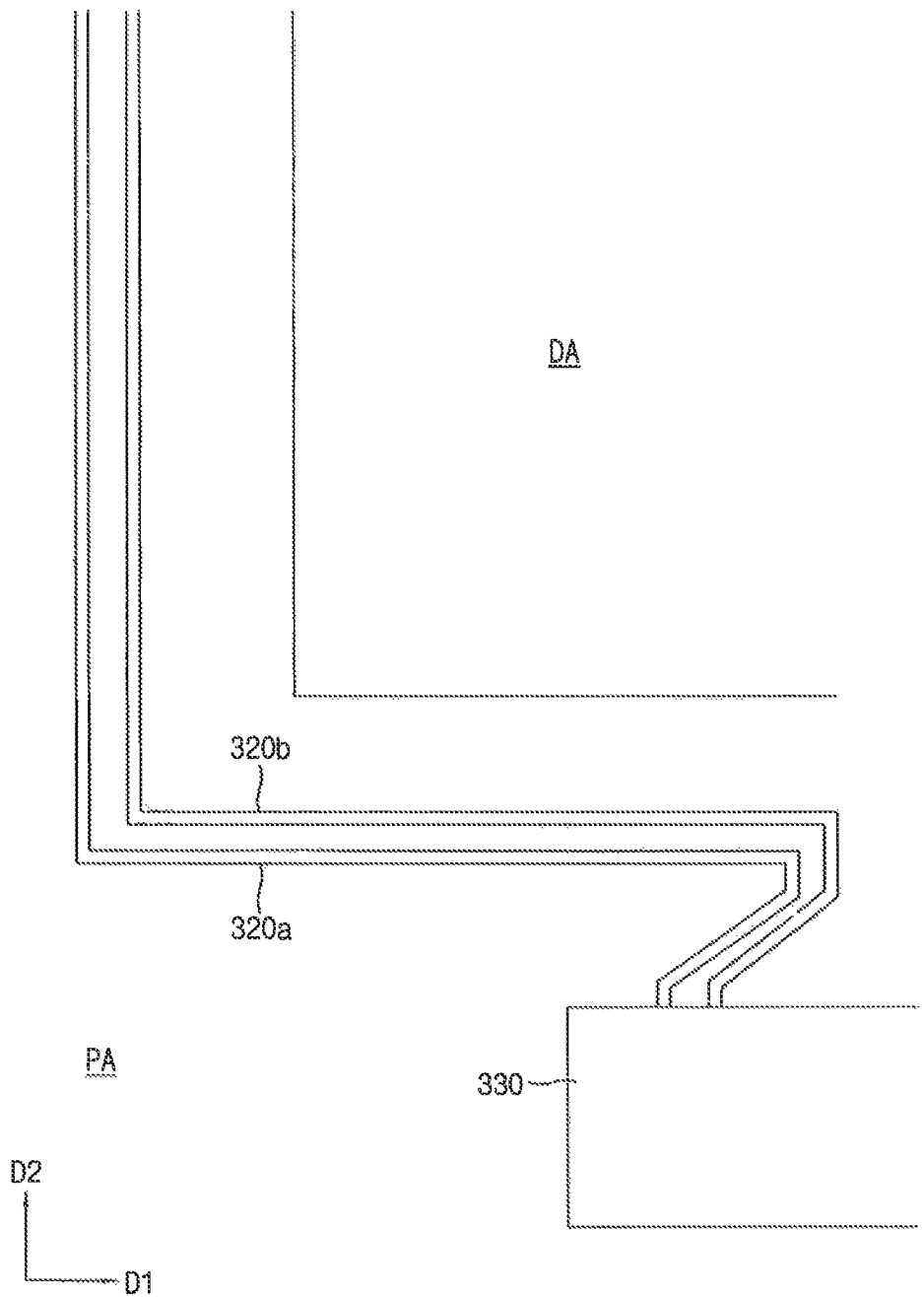
FIG. 3 is an enlarged plan view illustrating a lower left portion of the display apparatus of FIG. 1, according to an exemplary embodiment of the present invention.

FIG. 2 is an enlarged plan view illustrating an upper left portion of the display apparatus of FIG. 1, according to an exemplary embodiment of the present invention. FIG. 3 is an enlarged plan view illustrating a lower left portion of the display apparatus of FIG. 1, according to an exemplary embodiment of the present invention.

Referring to FIGS. 1 to 3, a first pixel PX1 and a second pixel PX2 may be disposed in the display area DA. The second pixel PX2 may be spaced apart from the first pixel PX in the first direction D1 and the second direction D2. Although only two pixels are shown in the drawing for convenience of illustration, the display apparatus may include a plurality of pixels PX arranged in a matrix form in the display area DA.

The data fan-out part 210 in the peripheral area PA may include a first data fan-out line 210a and a second data fan-out line 210b. The first data fan-out line 210a and the second data fan-out line 210b may be extended from the data IC 220 to the display area DA while being spread out from each other.

The first data fan-out line 210a may electrically connect the data IC 220 to a first data line DL1, which is extended in the second direction D2. The data IC 220 may be electrically connected to the first pixel PX1 through the first data fan-out line 210a the first data line DL1. The second data fan-out line 210b may electrically connect the data IC 220 to a second data line DL2, which is extended in the second direction D2. The data IC 220 may be electrically connected to the second pixel PX2 through the second data fan-out line 210b and the second data line DL2.

The ASG driving circuit 310 in the peripheral area PA may include a first ASG driving circuit 310a and a second ASG driving circuit 310b.

The first ASG driving circuit 310a may be electrically connected to the first pixel PX1 by a first gate line GL1, which is extended in the first direction D1. The first ASG driving circuit 310a may be electrically connected to the gate IC 330, which is disposed in the lower side portion of the peripheral area PA, through a first gate connecting line 320a. The first gate connecting line 320a is extended along the peripheral area PA.

The second ASG driving circuit 310b may be electrically connected to the second pixel PX2 by a second gate line GL2, which is extended in the first direction D1. The second ASG driving circuit 310b may be electrically connected to the gate IC 330, which is disposed in the lower side portion of the peripheral area PA, through a second gate connecting line 320a. The second gate connecting line 320a is extended along the peripheral area PA.

Figure 4:
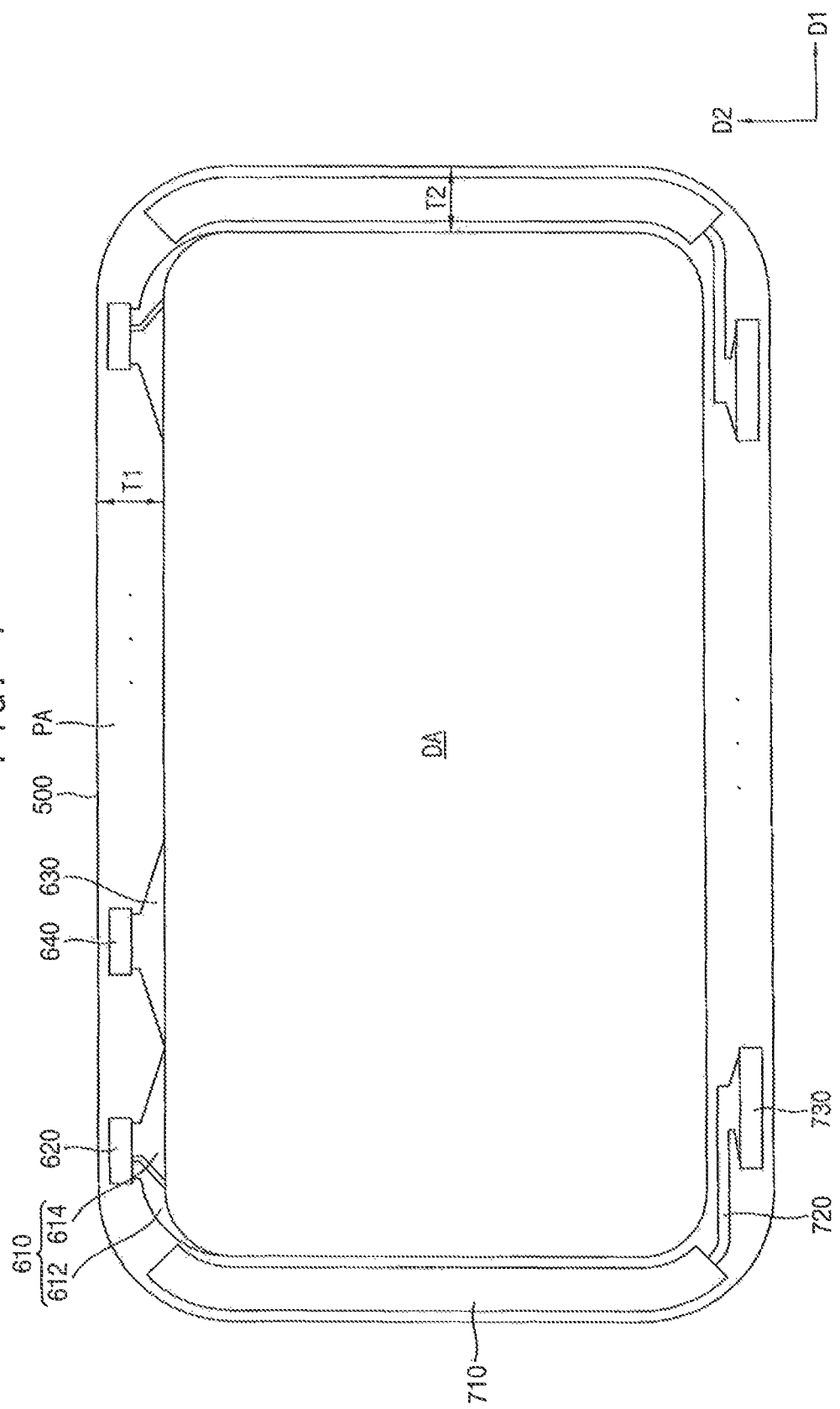
FIG. 4 is a plan view illustrating a display apparatus according to an exemplary embodiment of the present invention.

FIG. 4 is a plan view illustrating a display apparatus according to an exemplary embodiment of the present invention.

Referring to FIG. 4, a display apparatus 500 may include a display area DA and a peripheral area PA.

The display area DA may display an image on a plane formed by a first direction D1 and a second direction D2. The first and second directions D1 and D2 may be substantially perpendicular to each other. The display area DA may have a substantially rectangular shape, and four corner portions of the display area DA may have a curved or rounded shape. It is to be understood that the rounded corners of the display area DA need not have a constant radius of curvature. The corners of the display area DA may have varying radii of curvature.

The display apparatus 500 may include a plurality of pixels, a plurality of gate lines and a plurality of data lines in the display area DA.

The peripheral area PA may surround the display area DA on at least one side. The peripheral area PA is a non-display area. A portion of the peripheral area PA which is adjacent to the display area DA in the second direction D2, for example, an upper side portion and a lower side portion of the peripheral area PA, may have a first width T1. A portion of the peripheral area PA which is adjacent to the display area DA in the first direction D1, for example, a right side portion and a left side portion of the peripheral area PA may have a second width T2. The first width T1 and the second width T2 may be equal to each other. The four corner portions of the peripheral area PA may have a curved or rounded shape corresponding to the four corner portions of the display area DA.

The display apparatus 500 may include a first data fan-out part 610, a first data IC 620, a second data fan-out part 630, a second data IC 640, an ASG driving circuit 710, a gate connecting part 720 and a gate IC 730 in the peripheral area PA.

The second data fan-out part 630 may be disposed in the upper side portion (or lower side portion) of the peripheral area PA, which is adjacent to the display area DA in the second direction D2.

The first data fan-out part 610 may include a round data fan-out part 612 and a normal data fan-out part 614. The round data fan-out part 612 may be extended from the corner portion of the display area DA having the round shape to the first data IC 620. The normal data fan-out part 614 may be extended from an upper straight edge of the display area DA, disposed directly adjacent to the corner portion of the display area DA having the round shape, to the first data IC 620.

The first data IC 620 may be disposed in an end of the upper side portion (or lower side portion) of the peripheral area PA in the first direction D1. The first data IC 620 may be electrically connected to the first data fan-out part 610. The first data IC 620 may generate a data signal from an input signal received from an external device to provide the data signal to the data lines DL for driving the pixels PX. The data signal may be generated from the first data IC 620, and may be provided to the pixels PX through the first data fan-out part 610 and the data lines DL.

The second data IC 640 may be disposed in the upper side portion (or lower side portion) of the peripheral area PA, and be disposed adjacent to the first data IC 620 in the first direction D1. The second data IC 640 may generate a data signal from an input signal received from an external device to provide the data signal to the data lines DL for driving the pixels PX. The data signal may be generated from the second data IC 640, and may be provided to the pixels PX through the second data fan-out part 640 and the data line.

The first and second data ICs 620 and 640 may be integrated circuits fabricated in a chip form and may be mounted on a first substrate. The first and second data ICs 620 and 640 may be electrically connected to the first and second data fan-out parts 610 and 630, respectively.

The ASG driving circuit 710 may be disposed in a left side portion (or right side portion, or both the left and right side portions) of the peripheral area PA where the ASG driving circuit 710 is located adjacent to the display area DA in the first direction D1. The ASG driving circuit 710 may generate a gate signal from a preliminary gate signal received from the gate IC 730 to provide the gate signal to the gate lines GL. The gate signal may be generated from the ASG driving circuit 710 and may be provided to the pixels PX through the gate lines GL.

The ASG driving circuit 710 may be an amorphous silicon gate circuit formed in the peripheral area PA. The ASG driving circuit 710 may be simultaneously formed with a switching thin film transistor, the switching thin film transistor being formed in the display area DA The gate connecting part 720 may electrically connect the ASG driving circuit 710 to the gate IC 730. The gate connecting part 720 may be extended from the ASG driving circuit 710 to the gate IC 730 along the peripheral area PA.

The gate IC 730 may be disposed in the lower portion (or the upper portion) of the peripheral area PA. The gate IC 730 may be electrically connected to the gate connecting part 720. The gate IC 730 may generate the preliminary gate signal from an input signal received from an external device for driving the pixels PX. The preliminary gate signal may be generated from the gate IC 730 and provided to the ASG driving circuit 710 through the gate connecting part 720. The gate IC 730 may be an integrated circuit fabricated in a chip form. The gate IC 730 may be mounted on the first substrate and electrically connected to the gate connecting part 720.

The display apparatus 500 may include a first substrate, a second substrate facing the first substrate and a liquid crystal layer disposed between the first substrate and the second substrate. The first data fan-out part 610, the second data fan-out part 630, the ASG driving circuit 710 and the gate connecting part 720 may be disposed on the first substrate. A common electrode may be disposed on the second substrate.

Figure 5:
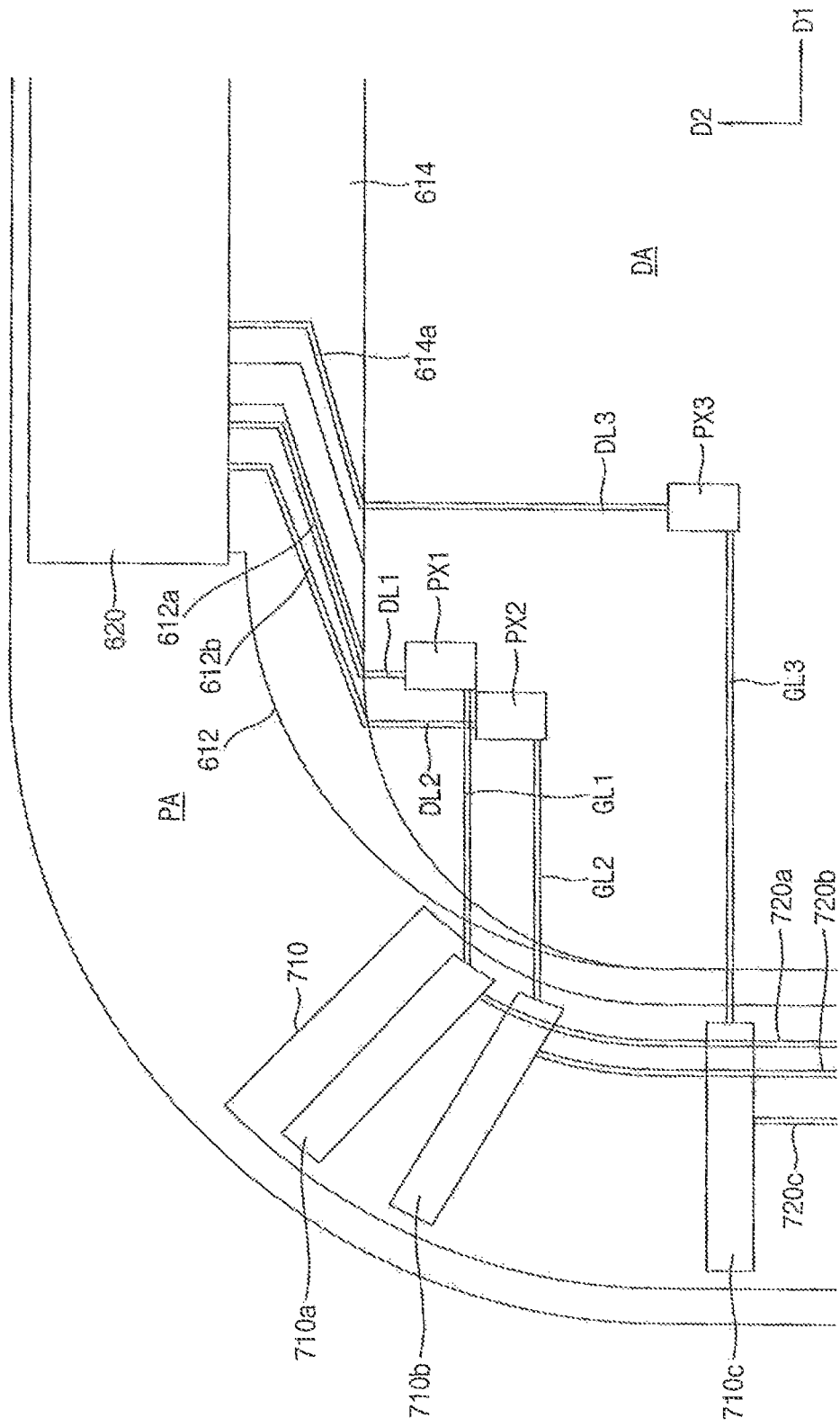
FIG. 5 is an enlarged plan view illustrating an upper left portion of the display apparatus of FIG. 1, according to an exemplary embodiment of the present invention.

FIG. 5 is an enlarged plan view illustrating an upper left portion of the display apparatus of FIG. 1, according to an exemplary embodiment of the present invention. FIG. 6 is an enlarged plan view illustrating a lower left portion of the display apparatus of FIG. 1, according to an exemplary embodiment of the present invention.

Referring to FIGS. 4 to 6, a first pixel PX1, a second pixel PX2 and a third pixel PX3 may be disposed in the display area DA. The first pixel PX1 and the second pixel PX2 may each be disposed in the corner portion of the display area DA which has the curved/rounded shape. The third pixel PX3 may be disposed in the display area DA. Although only three pixels are shown in FIG. 5 for convenience of illustration, the display apparatus may include any number of pixels arranged in a matrix form in the display area DA.

The round data fan-out part 612 may include a first round data fan-out line 612*a* and a second round data fan-out line 612*b*. The first round data fan-out line 612*a* may be extended from the corner portion of the display area DA which has the rounded/curved shape to the first data IC 620. For example, the first round data fan-out line 612*a* may be curved to correspond to the rounded/curved shape of the corner portion of the display area DA. For example, the round data fan-out part 612 may include at least two data lines (e.g., fan-out data lines) which are curved and which are progressively spaced apart from each other in a direction toward the display area DA, or toward the curved corner of the display area DA. Thus, sections along the first round data fan-out line 612*a* may be inclined with respect to the first and second directions D1 and D2. It is understood that although the first round data fan-out line 612*a* is shown to be straight in FIG. 5, the first round data fan-out line 612*a* may have at least a curved portion. Alternatively, the round data fan-out part 612 may have a round/curved footprint in plan view, as shown in FIG. 5, and the wires (e.g., fan-out data lines) included in the round/curved data fan-out part 612 may be straight, curved and/or partially bent in plan view. A normal data fan-out part 614 may include a normal (e.g., straight) data fan-out line 614*a*.

The first pixel PX1 may be electrically connected to the first round data fan-out line 612*a* through a first data line DL1, which is extended in the second direction D2. The second pixel PX2 may be electrically connected to the second round data fan-out line 612*b* through a second data line DL2, which is extended in the second direction D2. The third pixel PX3 may be electrically connected to the normal data fan-out line 614*a* through a third data line DL3, which is extended in the second direction D2.

The ASG driving circuit 710 in the peripheral area PA may include a first ASG driving circuit 710*a*, a second ASG driving circuit 710*b* and a third ASG driving circuit 710*c*.

The first ASG driving circuit 710*a* may be electrically connected to the first pixel PX1 through a first gate line GL1, which is extended in the first direction D1. The first ASG driving circuit 710*a* may be electrically connected to the gate IC 730, which is disposed in the lower side portion of the peripheral area PA, through a first gate connecting line 720*a*. The first gate connecting line 720*a* is extended along the peripheral area PA. The first ASG driving circuit 710*a* may be disposed in the corner portion of the peripheral area PA having the rounded shape. The first ASG driving circuit 710*a* may be disposed perpendicularly (or approximately perpendicularly) to a curve of the round shape of the corner portion of the peripheral area PA, as shown in FIG. 5.

The second ASG driving circuit 710*b* may be electrically connected to the second pixel PX2 through a second gate line GL2, which is extended in the first direction D1. The second ASG driving circuit 710*b* may be electrically connected to the gate IC 730, which is disposed in the lower side portion of the peripheral area PA, through a second gate connecting line 720*b*. The second gate connecting line 720*b* may be extended along the peripheral area PA. The second ASG driving circuit 710*b* may be disposed in the corner portion of the peripheral area PA having the rounded/curved shape. The second ASG driving circuit 710*b* may be disposed perpendicularly (or approximately perpendicularly) to a curve of the round shape of the corner portion of the peripheral area PA, as shown in FIG. 5.

Thus, a plurality of ASG driving circuits is disposed along the rounded/curved corners of the peripheral area PA.

The third ASG driving circuit 710*c* may be electrically connected to the third pixel PX3 through a third gate line GL3, which is extended in the first direction D1. The third ASG driving circuit 710*c* may be electrically connected to the gate IC 730, which is disposed in the lower side portion of the peripheral area PA, through a third gate connecting line 720*c*. The third gate connecting line 720*c* may be extended along the peripheral area PA.

According to an exemplary embodiment of the present invention, the gate IC 730 is disposed in the lower side portion of the peripheral area PA, the data IC 720 is disposed in the upper side portion of the peripheral area PA, the ASG driving circuit 710 is disposed in the left side and/or right side portion of the peripheral area PA, so that driving circuits in the peripheral area PA may be evenly/well distributed across the peripheral area PA. Accordingly, the first width T1 and the second width T2 may be small and equal or substantially equal each other. Thus, a display apparatus having a small bezel can be implemented. According to an exemplary embodiment of the present embodiment, the width of the peripheral area PA, may be about 5 mm or less. For example, according to an exemplary embodiment of the present embodiment, each of the first and second widths T1 and T2 may be about 5 mm or less.

While the present invention has been particularly shown and described with reference to exemplary embodiments thereof, it will be apparent to those of ordinary skill in the art that various changes in form and detail may be made therein without departing from the spirit and scope of the present invention.

What is claimed is:
1. A display apparatus comprising a display area, in which an image is displayed, and a peripheral area, which is a non-display area, the peripheral area surrounding the display area, the display apparatus comprising:
 a plurality of pixels disposed in the display area;
 a data integrated circuit (IC) disposed in a first side portion of the peripheral area, wherein the peripheral area is disposed adjacent to the display area;
 a gate IC disposed in a second side portion of the peripheral area, wherein the display area is disposed between the first and second side portions of the peripheral area;
 a data fan-out part disposed in the first side portion of the peripheral area, wherein the data fan-out part extends from the data IC to the display area, wherein the data fan-out part includes a plurality of wires that are spaced apart from each other in a fanned out manner, and
 a gate connecting part disposed in the second side portion of the peripheral area and electrically connecting the gate IC to an amorphous silicon gate (ASG) driving circuit disposed in a third side portion of the peripheral area, wherein the third side portion of the peripheral area is disposed adjacent to the display area in a first direction, and
 wherein the display apparatus further comprises:
 a gate line disposed in the display area, wherein the gate line is electrically connected to a first pixel of the plurality of pixels, and the gate line extends in the first direction; and a data line disposed in the display area, wherein the data line is electrically connected to the first pixel, and the data line extends in a second direction that crosses the first direction, wherein the data line is electrically connected to the data IC through one of the plurality of wires included in the data fan-out part, wherein the gate line is electrically connected to the gate IC through the gate connecting part, and wherein the data fan-out part is disposed between the data IC and the gate IC in the second direction.

2. The display apparatus of claim 1, wherein the ASG driving circuit receives a preliminary gate signal from the gate IC, and the ASG circuit provides a gate signal to the first pixel through the gate line.

3. The display apparatus of claim 2, wherein the first pixel comprises a thin film transistor comprising a semiconductor layer, wherein the semiconductor layer of the thin film transistor of the first pixel comprises amorphous silicon, and the ASG driving circuit comprises a thin film transistor comprising a semiconductor layer, wherein the semiconductor layer of the thin film transistor of the ASG driving circuit comprises amorphous silicon.

4. The display apparatus of claim 1, wherein the display area has a polygonal shape, and each corner of the display area is rounded or curved, and wherein each corner of the peripheral area is rounded or curved to match a curvature of a corresponding curved corner of the display area.

5. The display apparatus of claim 1, wherein the data IC comprises:

a first data IC disposed adjacent to one of the rounded or curved corners of the display area; and a second data IC disposed adjacent to the first data IC in the first direction, wherein the data fan-out part comprises a first data fan-out part electrically connected to the first data IC, and a second data fan-out part electrically connected to the second data IC, wherein the first data fan-out part includes a first portion and a second portion, wherein at least one of the plurality of wires included in the first portion is rounded or curved, and at least one of the plurality of wires included in the second portion is substantially straight, wherein the first portion of the first data fan-out part is extended from the first data IC to the one of the rounded or curved corners of the display area, and wherein the second portion of the first data fan-out part is extended from the first data IC to a straight edge portion of the display area adjacent to the one of the curved corners of the display area.

6. The display apparatus of claim 1, wherein the ASG driving circuit, the gate IC and the data IC are respectively disposed adjacent to different edges of the display area.

7. The display apparatus of claim 6, wherein, when the peripheral area has a length direction and a width direction, the ASG driving circuit extends along the length direction of the peripheral area, and wherein a portion of the ASG driving circuit is curved along at least one of the rounded or curved corners of the peripheral area.

8. A display apparatus comprising a display area in which an image is displayed, and a peripheral area which is a non-display area, wherein the peripheral area surrounds the display area, the display apparatus comprising:

a plurality of pixels disposed in the display area; and a data integrated circuit (IC) chip and a gate IC chip mounted on a first substrate in the peripheral area, a data fan-out part disposed in the peripheral area and extending from the data integrated circuit (IC) chip to the display area, wherein the display area has a polygonal shape, and a first corner of the display area is curved, wherein the gate IC chip is disposed in a second side portion of the peripheral area, wherein the peripheral area is disposed adjacent to the display area and the data IC chip is disposed in a first side portion of the peripheral area, wherein the display area is disposed between the first and second side portions of the peripheral area, and wherein a first corner of the peripheral area, which corresponds to the first corner of the display area, is curved to match a curvature of the first corner of the display area, wherein the display apparatus further comprises:

a gate connecting part disposed in the second side portion of the peripheral area and electrically connecting the gate IC chip to an amorphous silicon gate (ASG) driving circuit disposed in a third side portion of the peripheral area, wherein the third side portion of the peripheral area is disposed adjacent to the display area in a first direction;

a gate line disposed in the display area, wherein the gate line is electrically connected to a first pixel of the plurality of pixels, and the gate line extends in the first direction; and a data line disposed in the display area, wherein the data line is electrically connected to the first pixel, and the data line extends in a second direction that crosses the first direction, wherein the data line is electrically connected to the data IC through one of the plurality of wires included in the data fan-out part, and wherein the gate line is electrically connected to the gate IC through the gate connecting part, and wherein the data fan-out part is disposed between the data IC and the gate IC in the second direction.

9. The display apparatus of claim 8, wherein the data fan-out part is disposed in the first side portion of the peripheral area, wherein the data fan-out part includes wires that are progressively spaced apart from each other in a direction toward the display area.

10. The display apparatus of claim 8, wherein the data IC chip comprises:

a first data IC chip disposed adjacent to the first corner of the display area; and a second data IC chip disposed adjacent to the first data IC chip in the first direction, wherein the data fan-out part comprises a first data fan-out part electrically connected to the first data IC chip, and a second data fan-out part electrically connected to the second data IC chip, wherein the first data fan-out part includes a first portion and a second portion, wherein at least one of the wires included in the first portion is curved, and at least one of the wires included in the second portion is substantially straight, wherein the first portion of the first data fan-out part is extended from the first data IC chip to the first corner of the display area, and wherein the second portion of the first data fan-out part is extended from the first data IC chip to a straight edge portion of the display area adjacent to the first corner of the display area.

11. The display apparatus of claim 8,
wherein the ASG driving circuit receives a preliminary gate signal from the gate IC chip, provides a gate signal to a first pixel of the plurality of pixels through a gate line, and is at least partially curved along the first corner of the peripheral area,
wherein the ASG driving circuit extends along a direction in which the peripheral area extends.

12. A display apparatus, comprising:
a first pixel disposed in a display area;
a first data integrated circuit (IC) electrically connected to the first pixel and disposed in a peripheral area, wherein the peripheral area surrounds the display area on at least one side thereof; and
a gate IC electrically connected to the first pixel and disposed in the peripheral area,
a gate connecting part disposed in the peripheral area and electrically connected to the gate IC,
wherein the first data IC is disposed on a first side of the peripheral area, the first side of the peripheral area positioned between a first edge of the display area and a first edge of the display apparatus,
wherein the gate IC is disposed on a second side of the peripheral area, the second side of the peripheral area positioned between a second edge of the display area and a second edge of the display apparatus,
wherein the first side of the peripheral area is opposite the second side of the peripheral area, and
wherein the gate connecting part is configured to electrically connect the gate IC to a driving circuit disposed on a third side of the peripheral area, the third side of the peripheral area positioned between a third edge of the display area and a third edge of the display apparatus.

13. The display apparatus of claim 12, further comprising:
a data fan-out part extending from the data IC to the display area, wherein the data fan-out part includes wires that are spaced apart from each other in a direction toward the display area.

14. The display apparatus of claim 13, wherein the display area has a polygonal shape, and a first corner of the display area is curved, and
wherein a first corner of the peripheral area, which corresponds to the first corner of the display area, is curved to match a curvature of the first corner of the display area.

15. The display apparatus of claim 14, further comprises:
a second pixel disposed in the display area,
wherein the data fan-out part comprises a first data fan-out part and a second data fan-out part,
wherein the first data fan-out part is extended from the data IC to the first corner of the display area,
wherein the second data fan-out part is extended from the data IC to a first straight edge of the display area adjacent to the first corner of the display area,
wherein the first pixel is disposed adjacent to the first corner of the display area, and the first pixel is electrically connected to the data IC through the first data fan-out part, and
wherein the second pixel is disposed adjacent to the first straight edge of the display area, and the second pixel is electrically connected to the data IC through the second data fan-out part.

16. The display apparatus of claim 15, wherein the driving circuit is an amorphous silicon gate (ASG) driving circuit disposed at least partially along a straight portion of the peripheral area and at least partially along the first corner of the peripheral area,
wherein at least a portion of the ASG circuit that is disposed along the first corner of the peripheral area is curved.

\* \* \* \* \*